United States Patent [19]
Lin et al.

[11] Patent Number: 5,892,261
[45] Date of Patent: Apr. 6, 1999

[54] SRAM BITLINE PULL-UP MOSFET STRUCTURE FOR INTERNAL CIRCUIT ELECTRO-STATIC DISCHARGE IMMUNITY

[75] Inventors: Shi-Tron Lin, Taipei; Ta-Lee Yu, Hsin Chu; Chau Neng Wu, Kaohsing; Yu Chen Lin, Chia-I; Yang Sen Yeh, Taipei, all of Taiwan

[73] Assignee: Winbond Electronics Corp., Hsinchu, Taiwan

[21] Appl. No.: 780,670

[22] Filed: Jan. 7, 1997

[51] Int. Cl.⁶ .................................................. H01L 27/11
[52] U.S. Cl. ............................ 257/355; 257/903; 257/904
[58] Field of Search ................................. 257/355, 903, 257/904

[56] References Cited

U.S. PATENT DOCUMENTS

| | | | |
|---|---|---|---|
| 4,639,898 | 1/1987 | Sauer | 365/202 |
| 5,072,286 | 12/1991 | Minami et al. | 257/903 |
| 5,250,854 | 10/1993 | Lien | 307/296.1 |
| 5,394,358 | 2/1995 | Huang | 257/903 |
| 5,453,636 | 9/1995 | Eitan et al. | 257/903 |
| 5,554,874 | 9/1996 | Doluca | 257/903 |
| 5,576,560 | 11/1996 | Runaldue et al. | 257/903 |
| 5,652,441 | 7/1997 | Hashimoto et al. | 257/903 |

*Primary Examiner*—David B. Hardy
*Attorney, Agent, or Firm*—Meltzer, Lippe, Goldstein, et al.

[57] ABSTRACT

An apparatus and method for use in a semiconductor memory device to reduce internal circuit damage resulting from the effects of electro-static discharge (ESD) on a bitline pull-up or other type of circuit. Each of a plurality of bitlines in the memory device are coupled to a source terminal of a corresponding N-type MOSFET. Each source terminal is formed in a separate corner portion of at least one active region of the memory device, and is coupled to a given bitline via a bitline contact arranged in the corner portion. Each drain terminal of the N-type MOSFETS is formed from another portion of the active region and is coupled to a VDD supply of the memory device via a VDD contact. A gate terminal of a given MOSFET is formed from a polysilicon gate region overlying a channel in the active region. The gate region has an approximately 90° bend therein such that a bitline contact in the corresponding corner portion of the active region is located between the bend and an outer peripheral edge of the corner portion. This layout allows the contact-to-diffusion-edge and contact-to-gate-edge spacings of the VDD contacts to be increased such that internal circuit ESD immunity of the memory device is improved without impacting device dimension and layout area constraints.

17 Claims, 4 Drawing Sheets

SRAM BITLINE PULL-UP MOSFET STRUCTURE FOR INTERNAL CIRCUIT ELECTRO-STATIC DISCHARGE IMMUNITY

FIELD OF THE INVENTION

The present invention relates generally to semiconductor memory devices and more particularly to a semiconductor memory device which includes a bitline pull-up circuit having a structure designed to minimize internal circuit electro-static discharge (ESD) damage.

BACKGROUND OF THE INVENTION

Semiconductor memory devices are generally designed to be resistant to damage from electro-static discharge (ESD) events. The devices may be subjected to ESD testing to verify an appropriate level of ESD immunity. ESD testing of a memory device involves applying transient high voltage stresses to input, output and VDD supply pins of the device relative to a ground potential VSS supply. The device may include an ESD protection circuit having a number of pull-up or pull-down diodes used to limit the amount of applied transient voltage and current which are passed to internal device circuitry. A problem arises when an ESD transient applied to stress an input or output pin passes onto the device VDD supply via the pull-up or pull-down diodes of the ESD protection circuit. This can cause a number of internal circuit parasitics to turn on during an ESD event instead of or in addition to the designated ESD protection circuit. The internal circuit parasitics thus represent "weak spots" which are particularly susceptible to damage during an ESD event.

Exemplary internal circuit parasitics which may turn on before an ESD protection circuit can be formed by: (i) n+ diffusion regions connected to VDD (forming an n+/p-well diode between VDD and VSS); (ii) p+ diffusion regions connected to VSS (forming a p+/n-well diode between VDD and VSS); (iii) an n+ diffusion region connected to VDD adjacent to another n+ diffusion region connected to VSS (forming a parasitic npn bipolar transistor between VDD and VSS); and (iv) a p+ diffusion region connected to VDD adjacent to another p+ diffusion region connected to VSS (forming a parasitic pnp bipolar transistor between VDD and VSS). These and other elements of internal circuit parasitics are susceptible to damage when turned on during an ESD event because layout rules designed to minimize circuit dimensions often result in small contact-to-diffusion-edge and contact-to-gate-edge spacings for VDD contacts. The small spacings are often unable to withstand a large transient current generated during the ESD event. The parasitic turn-on problem is particularly acute in bitline pull-up circuits typically used in static random access memory (SRAM) devices.

FIG. 1 is a schematic diagram of an exemplary prior art bitline pull-up circuit suitable for use in an SRAM device. The pull-up circuit serves to set all bitlines to a common positive voltage to thereby provide faster bitline sensing through a sense amplifier. A number of conventional SRAM bitline pull-up circuits are described in greater detail in U.S. Pat. Nos. 4,639,898 and 5,250,854, which are incorporated by reference herein. The bitline pull-up circuit of FIG. 1 includes a number of N-type MOSFET devices N1 through N4. The source of each of the N-type MOSFETs N1 through N4 is coupled to a corresponding bitline BL1 through BL4. The drains of each of the N-type MOSFETs N1 through N4 are coupled to the VDD supply. The gates of N1 and N2 are coupled to a gate voltage VG1, while the gates of N3 and N4 are coupled to a gate voltage VG2. The two gate voltages may be the same voltage. During a read or write operation involving memory cells coupled to bitlines BL1 through BL4, the gate voltages VG1 and VG2 are raised from a logic "0" level to a logic "1" level to turn on N1 through N4. The bitlines BL1 through BL4 are thereby pulled up via N1 through N4 to a positive voltage which depends on the circuit design. For example, BL1 through BL4 may be pulled up to about 3.5 V in a circuit in which VDD is 5 volts. The N-type devices N1 through N4 in the bitline pull-up circuit of FIG. 1 are generally formed from n+ diffusion regions which, as noted above, can be particularly susceptible to ESD-induced damage.

FIG. 2 shows a conventional layout of the bitline pull-up circuit of FIG. 1. The bitlines BL1 through BL4 are formed from regions 10-1 through 10-4 which may be metallized regions of a first metallization (M1) layer in the memory device. First and second n+ diffusion regions 12, 14 are used to form source and drain regions of the N-type MOSFETs N1 through N4. The diffusion regions 12, 14 represent "active" regions containing separate source regions, drain regions and channels of the MOSFETs N1 through N4. Although these active regions will be generally referred to herein as n+ diffusion regions, it should be understood that a given active region contains not only distinct source and drain diffusion regions for the MOSFETs formed in that region, but also various non-diffusion regions.

The VDD supply is coupled to a VDD region 16 which may also be part of an M1 layer in the memory device. The gate voltage VG1 is coupled to a polysilicon gate region 18 and the gate voltage VG2 is coupled to a polysilicon gate region 20. The gate voltages VG1 and VG2 are coupled to a common voltage source. Contacts 22-1, 22-2, 22-3 and 22-4 connect respective source regions of N-type MOSFETs N1, N2, N3 and N4 formed from the n+ diffusion regions 12 and 14 to the corresponding respective bitline regions 10-1, 10-2, 10-3 and 10-4. VDD contacts 24 connect drain regions of N1 and N4 formed from n+ diffusion region 12 to the VDD region 16, and VDD contacts 26 connect drain regions of N2 and N3 formed from n+ diffusion region 14 to the VDD region 16.

The memory device which includes the pull-up circuit shown in FIG. 2 generally includes a p-well connected to the VSS supply of the device. The n+ diffusion regions 12, 14 form n+/p-well diodes with this p-well connected to VSS. As noted above, the n+/p-well diodes represent a weak link between VDD and VSS, and are susceptible to damage during an ESD event when the n+ diffusion regions 12, 14 and contacts 22-1, 22-2, 22-3, 22-4, 24 and 26 are arranged in a conventional layout such as that shown in FIG. 2. The conventional layout generally places the VDD contacts 24 and 26 in VDD region 16 relatively close to the edge of the respective n+ diffusion regions 12, 14 in order to optimize the chip layout. During an ESD event, if the n+/p-well diode breaks down due to the transient high voltage between VDD and VSS, then the ESD current flowing through the n+/p-well diode will raise the local temperature of the diode junction around the edge of the n+ diffusion region 12, 14. When the VDD contacts 24 and 26 are too close to the n+ diffusion edge, the metal at these contacts can easily reach a melting temperature (e.g., 550° C. for the eutectic temp of Al-Si interdiffusion), thus causing metal spiking and contact leakage. Similar problems result from restrictions on maximum contact-to-gate-edge spacing for the VDD contacts in the conventional bitline pull-up circuit layout of FIG. 2. The use of the FIG. 2 layout in a memory device therefore renders the device particularly susceptible to ESD-induced internal circuit damage.

As is apparent from the above, a need exists for an improved bitline pull-up circuit layout in which the contact-to-diffusion-edge and contact-to-gate-edge spacings can be increased for VDD contacts such that the device exhibits enhanced immunity to ESD damage, without violating device dimension and chip area restrictions.

SUMMARY OF THE INVENTION

The present invention provides an improved semiconductor memory device which includes a bitline pull-up circuit with a layout designed to minimize the likelihood of internal circuit damage resulting from electro-static discharge (ESD) events.

In accordance with a preferred embodiment of the invention, each of a plurality of bitlines in a memory device are coupled to a source terminal of a corresponding pull-up N-type MOSFET. Each source terminal is formed in a separate corner portion of at least one active region of the memory device, and is coupled to a given bitline via a bitline contact arranged in the corner portion. Each drain terminal of the pull-up N-type MOSFETS is formed from another portion of the active region and is coupled to a VDD supply of the memory device via a VDD contact. A gate terminal of a given MOSFET is formed from a polysilicon gate region overlying the active region. The gate region has an approximately 90° bend therein such that a bitline contact in the corresponding corner portion of the active region is located between the bend and an outer peripheral edge of the corner portion. For example, the bitline contact in the corner portion of the active region may be substantially surrounded by the gate region bend and the outer peripheral edge of the corner portion. The gate region may also overlap field oxide regions adjacent to each of two sides of the outer peripheral edge of the active region. The MOSFET coupled to the given bitline is operative to pull up the given bitline to the VDD supply voltage of the memory device under control of a gate voltage applied to the gate terminal. The invention may also be applied to P-type MOSFETS formed in p+ diffusion regions of a memory device.

The memory device circuit layout of the present invention allows a significant increase in the contact-to-diffusion-edge and contact-to-gate-edge spacings for VDD contacts, such that internal circuit ESD immunity of the memory device is improved without impacting device dimension and layout area constraints. These and other advantages and features of the present invention will become more apparent from the accompanying drawings and the following detailed description of the invention.

DETAILED DESCRIPTION OF THE INVENTION

The present invention will be illustrated herein in conjunction with an exemplary bitline pull-up circuit suitable for use in a static random access memory (SRAM) device. It should be understood, however, that the present invention is not limited to use with any particular type of memory device or circuit. The invention is instead more broadly applicable to any memory device or circuit in which it is desirable to reduce or eliminate internal circuit damage arising from electro-static discharge (ESD) events. Although the invention is particularly well-suited for use with bitline pull-up circuits, including those described in greater detail in the above-cited U.S. Pat. Nos. 4,639,898 and 5,250,854, the invention may be used to improve ESD immunity in other types of circuits. Furthermore, although illustrated using a bitline pull-up circuit based on NMOS devices, it will be readily apparent that the techniques described are equally applicable to pull-up circuits utilizing PMOS devices as well as other types of field effect transistors. It should also be emphasized that any device dimensions referred to herein are exemplary only, and will generally vary depending upon the design requirements of a given application. The term "non-control terminal" will be used to refer to either a source or drain terminal of a field effect transistor.

Figure 3:
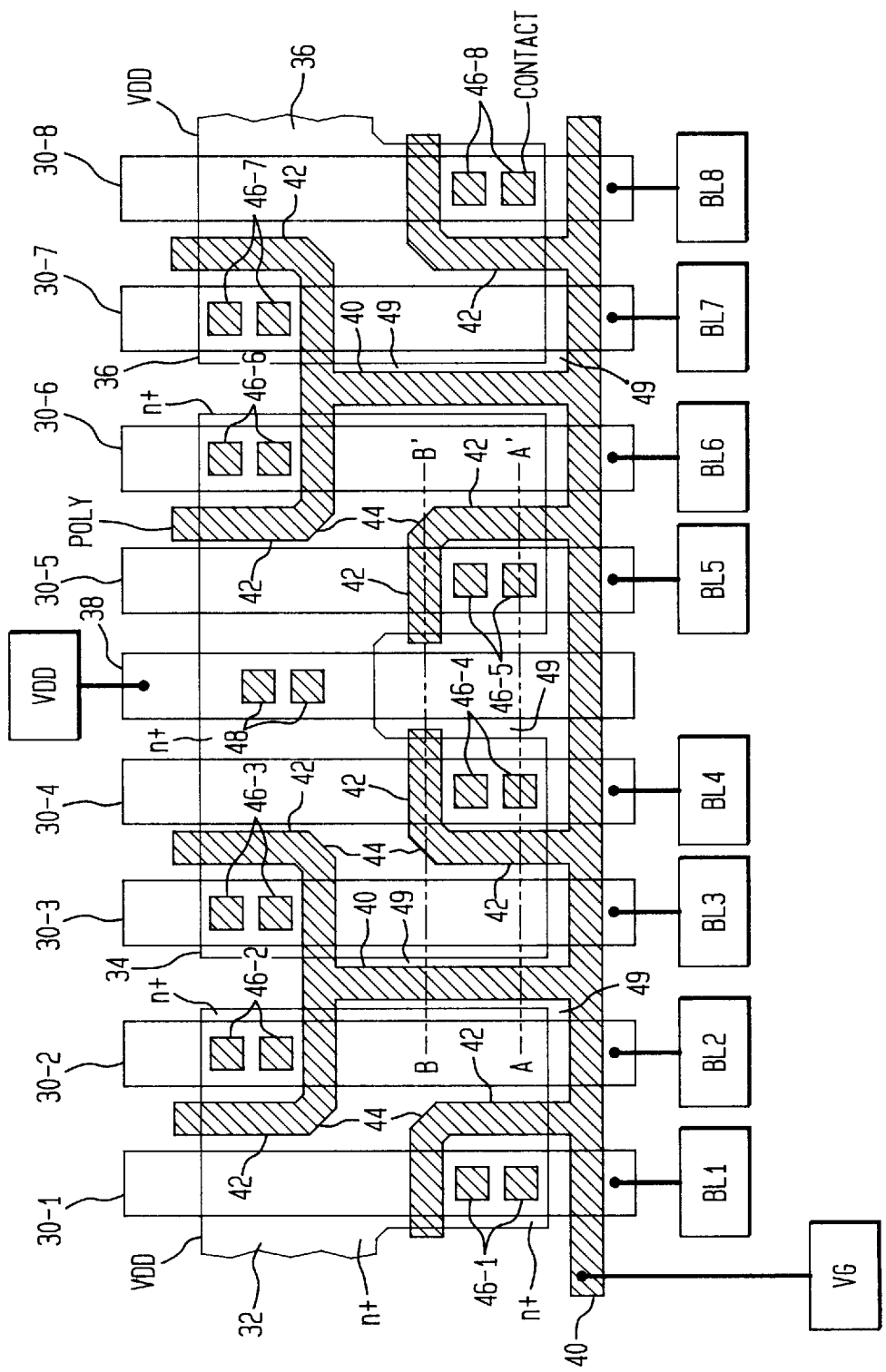
FIG. 3 shows a bitline pull-up circuit structure in accordance with one embodiment of the present invention.

FIG. 3 shows an exemplary layout for an NMOSFET bitline pull-up circuit suitable for use in an SRAM memory device in accordance with the present invention. The pull-up circuit of FIG. 3 includes eight N-type MOSFETS, each of which control the pull-up of one of the bitlines BL1 through BL8 of the SRAM memory device. The bitlines BL1 through BL8 are coupled to respective bitline regions 30-1 through 30-8 which may be part of a conventional M1 layer in the memory device. First, second and third n+ diffusion regions 32, 34 and 36 are used to form source and drain terminals of the eight N-type MOSFET devices in the pull-up circuit. A VDD supply of the memory device is coupled to a VDD region 38 which may also be part of a conventional M1 layer. The n+ diffusion regions may be formed by a conventional diffusion process and may have an impurity concentration on the order of $10^{20}/cm^3$ to $10^{21}/cm^3$. The diffusion regions 32, 34 and 36 represent "active" regions containing separate source regions, drain regions and channels of the eight MOSFETs in the pull-up circuit. As noted previously, although these active regions will be generally referred to herein as n+ diffusion regions, it should be understood that a given active region contains not only distinct source and drain diffusion regions for the MOSFETs formed in that region, but also various non-diffusion regions.

A polysilicon region 40 includes a number of polysilicon gate regions 42 each having a bend 44. The polysilicon gate regions 42 provide gate terminals for the eight N-type MOSFETS in the pull-up circuit of FIG. 3. Each of the polysilicon gate regions 42 may be on the order of 0.4 μm wide and 3000 Å thick, with a length of approximately 0.5 μm to 3 μm on each side of the bend 44. All of the gate terminals of the eight N-type MOSFETS in this exemplary embodiment are connected via polysilicon region 40 to a common gate voltage source VG. Contacts 46-1 through 46-8 connect respective source regions of the eight N-type MOSFETs formed from the n+ diffusion regions 32, 34 and 36 to the corresponding respective bitline regions 30-1 through 30-8. Contacts 48 connect drain regions of four N-type MOSFETS coupled to bitlines BL3, BL4, BL5 and BL6 to the VDD region 38. The dimensions of the contacts 46-i and 48 may be on the order of 0.4 μm by 0.4 μm. The drain regions of the two N-type MOSFETS coupled to bitlines BL1 and BL2 are connected via n+ diffusion region 32 to a VDD region (not shown) located to the left of bitline region 30-1, and the drain regions of the two N-type MOSFETS coupled to bitlines BL7 and BL8 are connected via n+ diffusion region 36 to a VDD region (not shown) located to the right of bitline regions 30-8.

The contacts 46-1 through 46-8 connecting respective bitlines BL1 through BL8 to n+ diffusion regions 32, 34 or 36 are arranged in a corner of the corresponding regions 32, 34 or 36. A number of these corners of the diffusion regions 32, 34 and 36 include a continuous, approximately 90° bend at the diffusion region edge as shown in FIG. 3. The corresponding portion of the polysilicon gate region 42 includes an approximately 90° bend which serves to isolate the bitline contacts 46-i of the n+ diffusion regions 32, 34 or 36 from the VDD contacts of those regions. It should be noted that the bends 44 of the polysilicon gate regions 42 may be rounded to avoid electric field crowding.

Figure 1:
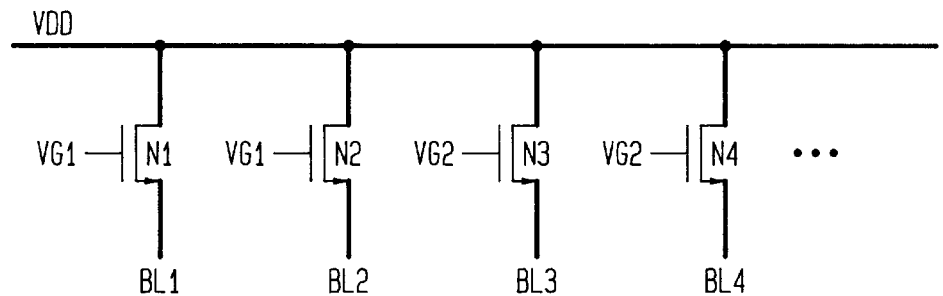
FIG. 1 is a schematic diagram of a prior art bitline pull-up circuit.
Figure 2:
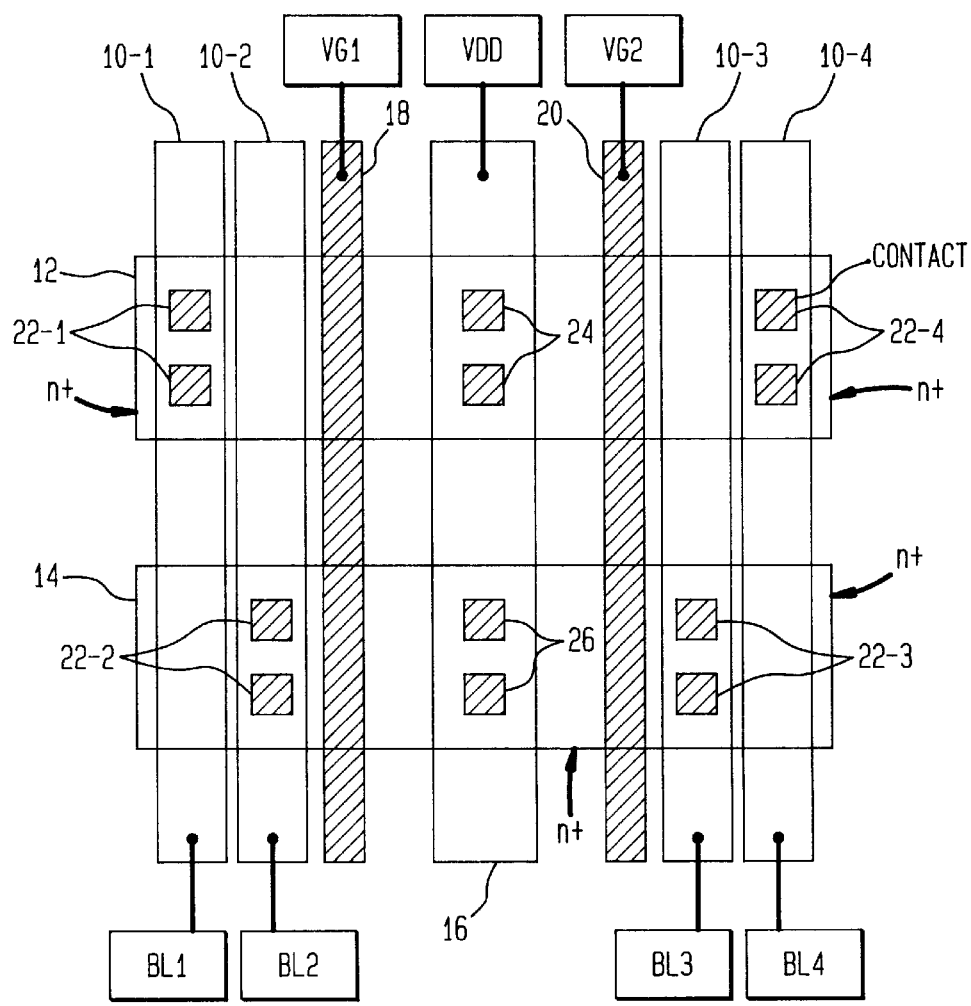
FIG. 2 shows a structure for the prior art circuit of FIG. 1.

It is apparent from the FIG. 3 layout that this arrangement of bitline contacts 46-i and polysilicon gate 42 allows the spacing between the VDD contact 48 and the diffusion edge to be significantly increased, without increasing the bitline dimensions or total device area. Alternatively, the bitline dimensions and total device area can be as reduced without adversely impacting the VDD contact-to-diffusion-edge spacing. The FIG. 3 layout also allows the contact-to-gate-edge spacing of the VDD contacts 48 to be increased by approximately one metal line pitch. The metal line pitch of a given bitline is defined as the line width of the given bitline plus the space between the given bitline and the adjacent bitline. In order to optimize the SRAM cell layout area, parallel bitlines are typically formed as densely as possible subject to the metal line pitch design rule for M1. It can be seen from the FIG. 3 layout that the spacing between VDD contact 48 and the polysilicon gate region 42 associated with bitline BL6 is increased by the M1 pitch of BL5, when compared to the spacing between VDD contact 24 and polysilicon gate region 20 in the conventional FIG. 2 layout.

The n+ diffusion regions 32, 34 and 36 are separated from each other by field oxide regions 49. Each of the polysilicon gate regions 42 overlaps two field oxide edges which define the boundaries of the corresponding n+ diffusion region and are approximately perpendicular to each other. Portions of the polysilicon region 40 are arranged on top of the field oxide regions 49 which separate the n+ diffusion regions 32, 34 and 36. These portions of polysilicon region 40 serve to connect the multiple polysilicon gate regions 42 of the eight N-type MOSFETS in the pull-up circuit of FIG. 3. The gate voltage VG is normally set to a logic "0" level but is switched to a logic "1" level during a read or write operation to turn on the eight N-type MOSFETS and thereby pull up each of the bitlines BL1 through BL8 to a positive voltage which depends on the circuit design. For example, BL1 through BL8 may be pulled up to about 3.5 V in a circuit in which VDD is 5 volts.

Figure 4A:
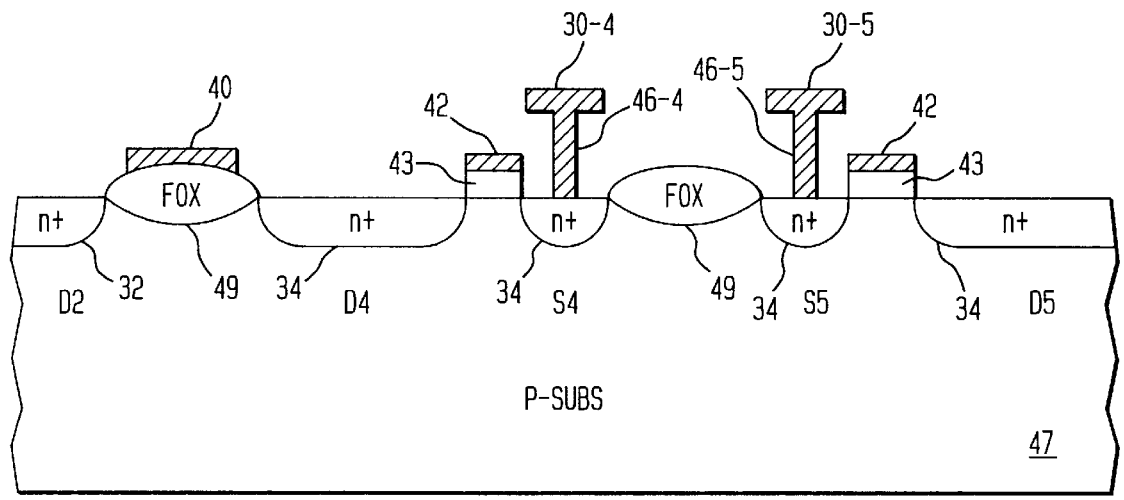
FIGS. 4A and 4B show simplified cross-sectional views of the bitline pull-up circuit of FIG. 3.
Figure 4B:
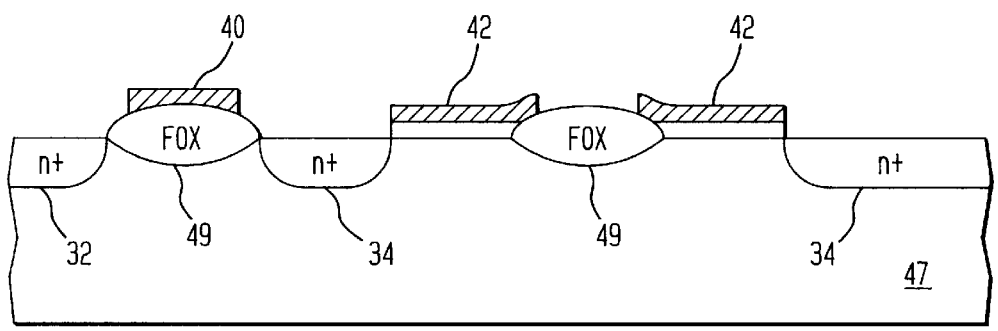

FIGS. 4A and 4B show simplified cross-sectional views of portions of the FIG. 3 bitline pull-up circuit taken along respective section lines A-A' and B-B'. FIGS. 4A and 4B show a P-type substrate 47 on which the FIG. 3 circuit is formed. Field oxide regions 49 separate adjacent N-type MOSFETs formed in the substrate 47. FIG. 4A shows the interconnection of the bitline regions 30-4 and 30-5 via respective bitline a contacts 46-4 and 46-5 to respective source regions $34_{S4}$ and $34_{S5}$ of n+ diffusion region 34. The polysilicon gate regions 42 overlay thin gate oxide regions 43 and the respective channels of the N-type MOSFETS associated with bitlines BL4 and BL5. These N-type MOSFETS include the above-noted source regions $34_{S4}$ and $34_{S5}$ as well as drain regions $34_{D4}$ and $34_{D5}$, all formed in the n+ diffusion region 34. FIG. 4A also shows a portion of a drain region $32_{D2}$ of the N-type MOSFET associated with bitline BL2. It can be seen from FIG. 4B that portions of the polysilicon gate regions 42 overlap edges of the field oxide region 49.

Figure 5:
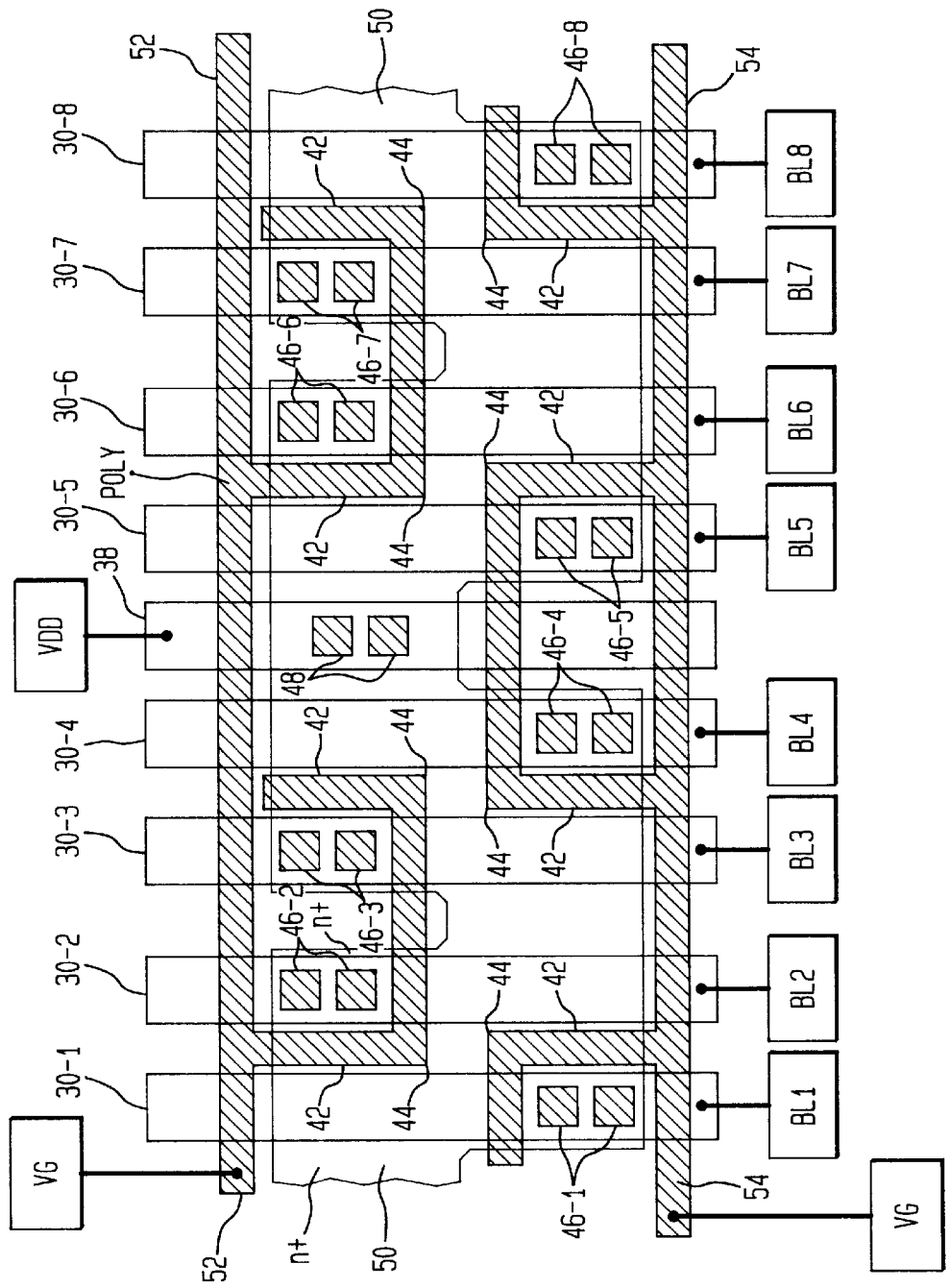
FIG. 5 shows a bitline pull-up circuit structure in accordance with another embodiment of the present invention.

FIG. 5 shows a bitline pull-up circuit layout in accordance with an alternative embodiment of the invention. The FIG. 5 embodiment includes a single n+ diffusion region 50 in place of the first, second and third n+ diffusion regions 32, 34 and 36 of the FIG. 3 embodiment. This arrangement serves to maximize the area of a parasitic n+/p-well diode created between the n+ diffusion region 50 and an underlying p-well in the device substrate, and thereby improves the ESD immunity of the parasitic diode as well as other parasitic internal circuit elements. Increasing the area of the n+ diffusion region 50 in this manner also serves to reduce the drain resistance of the N-type MOSFETs formed in the n+ diffusion region 50 and thereby facilitates bitline pull-up operation.

Other alternative embodiments of the invention may utilize gate regions formed from material other than polysilicon. Also, the gate regions 42 need not have a 90° bend, and other bends with angles in the range between, for example, about 30° to 100° may be used. In addition, although the gate region 42 and an outer peripheral edge of the diffusion regions surround the bitline contacts 46-i in the embodiments of FIGS. 3 and 4, other embodiments could utilize a gate region which partially surrounds the contacts in conjunction with the diffusion region outer peripheral edge. The term "substantially surrounding" as used herein is intended to include such partial surrounding implementations.

The present invention provides a bitline pull-up circuit layout which strengthens internal circuit "weak spots" by providing a layout in which contact-to-diffusion-edge spacing and contact-to-gate-edge spacing of the VDD contacts can be significantly increased without unduly impacting bitline and layout area design constraints. The bitline contacts for a given pull-up N-type MOSFET are made in corners of an n+ diffusion region, and a polysilicon gate with an approximately 90° bend isolates the bitline contacts from VDD-connected portions of the n+ diffusion region. The VDD contacts of this structure exhibit an increased contact-to-diffusion-edge and contact-to-gate-edge spacing, and the corresponding memory device is therefore considerably less susceptible to ESD-induced damage than prior art devices which utilize conventional pull-up circuit layouts.

The above-described embodiments of the invention are intended to be illustrative only. Numerous alternative embodiments within the scope of the appended claims will be apparent to those of ordinary skill in the art.

The claimed invention is:

1. An apparatus for use in a semiconductor memory device including a memory array with a plurality of bitlines, the apparatus comprising:

an active region having a corner portion thereof coupled to a given bitline of the memory array via a first contact, wherein the corner portion of the active region coupled to the given bitline forms a first non-control terminal of an N-type MOS field effect transistor (FET) coupled to the given bitline, said non-control terminal being a source terminal of said N-type MOSFET; and a gate region overlying a channel in the active region and forming a gate terminal of the field effect transistor, the gate region having a bend therein such that the first contact in the corner portion of the active region is located between the bend and an outer peripheral edge of the corner portion.

2. The apparatus of claim 1 wherein the first contact in the corner portion of the active region is substantially surrounded by the bend and said outer peripheral edge of the corner portion.

3. The apparatus of claim 1 wherein the bend in the gate region is an approximately 90° bend.

4. The apparatus of claim 1 wherein the field effect transistor coupled to the given bitline is operative to pull up the given bitline to a supply voltage of the memory device under control of a gate voltage applied to the gate terminal.

5. The apparatus of claim 1 wherein a second portion of the active region is coupled to a VDD supply of the memory device via a second contact, and the second portion of the active region forms a second non-control terminal of the field effect transistor.

6. The apparatus of claim 1 wherein the gate region overlaps field oxide regions adjacent to each of two sides of the outer peripheral edge of the active region.

7. A method for use in a semiconductor memory device including a memory array with a plurality of bitlines, the method comprising the steps of:

coupling a corner portion of an active region to a given bitline of the memory array via a first contact, wherein the corner portion of the active region coupled to the given bitline forms a first non-control terminal of an N-type MOS field effect transistor (FET) coupled to the given bitline, said non-control terminal being a source terminal of said N-type MOSFET; and forming a gate terminal of the field effect transistor from a gate region overlying a channel in the active region, the gate region having a bend therein such that the first contact in the corner portion of the active region is located between the bend and an outer peripheral edge of the corner portion.

8. The method of claim 7 wherein the first contact in the corner portion of the active region is substantially surrounded by the bend and an outer peripheral edge of the corner portion.

9. The method of claim 7 wherein the bend in the gate region is an approximately 90° bend.

10. The method of claim 7 further including the step of the field effect transistor pulling up the given bitline to a supply voltage of the memory device under control of a gate voltage applied to the gate terminal.

11. The method of claim 7 further including the step of coupling a second portion of the active region to a VDD supply of the memory device via a second contact to thereby form a second non-control terminal of the field effect transistor.

12. The method of claim 7 wherein the step of forming the gate terminal further includes forming the gate region such that the gate region overlaps field oxide regions adjacent to each of two sides of the outer peripheral edge of the active region.

13. A semiconductor memory device comprising:

a memory array;

a plurality of bitlines coupled to the memory array;

a first active region having a corner portion thereof coupled to a first bitline of the memory array via a first contact, wherein the corner portion of the first active region coupled to the first bitline forms an N-type MOS field effect transistor (FET) coupled to the given bitline, said non-control terminal being a source terminal of said N-type MOSFET; and a first gate region overlying a channel adjacent the first active region and forming a gate terminal of the field effect transistor, the gate region having a bend therein such that the first contact in the corner portion of the first active region is located between the bend and an outer peripheral edge of the corner portion.

14. The apparatus of claim 13 wherein the first contact in the corner portion of the active region is substantially surrounded by the bend and an outer peripheral edge of the corner portion.

15. The apparatus of claim 13 wherein the field effect transistor coupled to the given bitline is operative to pull up the given bitline to a supply voltage of the memory device under control of a gate voltage applied to the gate terminal.

16. A semiconductor memory device comprising:

a memory array;

a plurality of bitlines coupled to the memory array;

a first active region having a corner portion thereof coupled to a first bitline of the memory array via a first contact, wherein the corner portion of the first active region coupled to the first bitline forms a first non-control terminal of a field effect transistor coupled to the first bitline;

a first gate region overlying a channel adjacent the first active region and forming a gate terminal of the field effect transistor, the gate region having a bend therein such that the first contact in the corner portion of the first active region is located between the bend and an outer peripheral edge of the corner portion;

a second active region having a corner portion thereof coupled to a second bitline of the memory array via a first contact, wherein the corner portion of the second active region coupled to the second bitline forms a first non-control terminal of a field effect transistor coupled to the second bitline; and a second gate region overlying a second channel adjacent the second active region and forming a gate terminal of the field effect transistor, the second gate region having a bend therein such that the first contact in the corner portion of the second active region is located between the bend and an outer peripheral edge of the corner portion, wherein the first and second active regions correspond to different portions of a single large active region.

17. The apparatus of claim 16 wherein the first and second active regions correspond to distinct active regions separated by field oxide regions.

* * * * *